United States Patent [19]

Suhr et al.

[11] Patent Number: 4,975,340

[45] Date of Patent: Dec. 4, 1990

[54] PROCESS FOR MAKING A THIN MOLYBDENUM SULFIDE FILM AND ARTICLE

[75] Inventors: Harald Suhr, Tübingen; Reiner Schmid, Reutlingen; Iris Traus, Kusterdingen-Wankheim, all of Fed. Rep. of Germany

[73] Assignee: Schering Aktiengesellschaft, Berlin and Bergkamen, Fed. Rep. of Germany

[21] Appl. No.: 417,875

[22] Filed: Oct. 6, 1989

[30] Foreign Application Priority Data

Oct. 6, 1988 [DE] Fed. Rep. of Germany ....... 3834356

[51] Int. Cl.$^5$ .............................................. B32B 9/00
[52] U.S. Cl. ................................... 428/698; 156/643; 427/39; 427/70; 427/109; 427/126.2; 427/164; 427/166; 427/255; 427/255.2; 427/309; 428/704; 428/938

[58] Field of Search ............... 427/39, 70, 109, 126.2, 427/164, 166, 255, 255.2, 309; 428/704, 938; 156/643

[56] References Cited

U.S. PATENT DOCUMENTS

| | | | |
|---|---|---|---|
| 4,226,898 | 10/1980 | Ovsltinsky et al. | ............... 427/39 X |
| 4,540,607 | 9/1985 | Tsao et al. | ........................... 427/253 |
| 4,687,560 | 8/1987 | Tracy et al. | ...................... 427/39 X |

*Primary Examiner*—Bernard Pianalto
*Attorney, Agent, or Firm*—Michael J. Striker

[57] ABSTRACT

The process for making a thin Molybdenum sulfide film on a substrate in which the physical properties vary in a wide range and can be adjusted to the desired values comprises depositing on the substrate from a reaction gas mixture in the gas phase. This can be accomplished by decomposing a volatile molybdenum compound together with a volatile sulfur compound as a reactive gas in a glow discharge to form the reaction gas mixture in the presence of the substrate. The molybdenum compound can be molybdenum hexacarbonyl. The sulfur compound can be hydrogen sulfide.

15 Claims, No Drawings

PROCESS FOR MAKING A THIN MOLYBDENUM SULFIDE FILM AND ARTICLE

BACKGROUND OF THE INVENTION

Our invention relates to a process for making thin molybdenum sulfide films having a wide range of properties and, more particularly, to a process for making a molybdenum sulfide film having a thickness between several hundred to 5000 Å and to the molybdenum sulfide films made therefrom.

The manufacture of molybdenum sulfide film is known. Different processes for making targets made of pressed molybdenum disulfide powder by cathodic RF sputtering have been described. However great disadvantages are connected with the use of this technique. It has been established by Mikkelsen, et al, Apply. Phys. Lett. 52(14), 1130(1988), that the films obtained by RF-sputtering have a very greatly reduced density compared with crystalline Molybdenum sulfide, since the material made in this way is very disordered in its crystalline structure and has a high proportion of impurities.

The physical properties of the film are clearly poor in contrast to molybdenum sulfide. The density of these films can be increased to the value of the cyrstalline material by an aftertreatment (400 kV Argon Ion Bombardment). The enormous power densities required limit these manufacturing methods to a few materials. Considerable contamination of the films by water which has a negative influence on the physical properties has been reported. This is because the cathodes must be cooled in order to prevent heating of the target so that residual water can condense; among other things the Molybdenum disulfide powder of the target takes up water, since it is hygroscopic in the powder finely-divided state. These problems are practically excluded by the In situ production of Molybdenum sulfide according to the process of out invention. An additional disadvantage of the described process is that it is difficult to attain a sufficient adherence on the substrate material. To accomplish sufficient adhesion frequently adhesion promotors or glue layers must be used.

The range of application of the known process is limited so that in sputtering processes extraordinarily sensitive substrates such as aluminum oxide ceramics, aluminum nitride, ceramics or noble steel can not be coated without problems. Likewise materials sensitive to higher temperatures such as Teflon, Polyimide, Epoxy resin or other plastic materials can not be used because of the high energy densities.

It is an object of our invention to provide strongly adhering thin layers of molybdenum sulfide of variable composition on any substrate. The electrical and triboelectric properties of these films are variable within a wide range and can be set to any desired value. The semifinished products so made are used in vacuum engineering, air and space vehicles, street and rail traffic control and in machine engineering. Use of layers, particularly for dry lubrication of bearings and sliding surfaces, which are subjected to extreme thermal stress, since the thermal resistance of these layers is very high.

Because of their catalytic properties the layers can be deposited on suitable supporting materials, also they can be used in the chemical industry as catalysts. Moreover use of molybdenum sulfide films in sensor engineering is of interest because of the electrical and chemical properties.

The electrical and optical properties of Molybdenum sulfide films open up the possibility applications in microelectronics and electrooptics.

The use of molybdenum sulfide films made with RF sputtering engineering of these applications is possible because of the previously named properties only with limitations regarding the band structure and the state densities. Since the electronic properties of the materials strongly perturbed in their crystalline structure are not adjustable, their use in microelectronics and electrooptics has not been possible previously.

SUMMARY OF THE INVENTION

It is an object of the present invention to provide an improved process for making a thin molybdenum sulfide film directly on a substrate, by which the physical properties of the thin molybdenum sulfide film may be selected over a wide range and adjusted to desired values to produce a film suitable for an electrooptical layer, a self-lubricating layer or a chemically catalytic layer on a wide variety of substrates and/or having the density of crystalline molybdenum sulfide.

It is also an object of the present invention to make an improved molybdenum sulfide film useful as an electrooptical layer, a self-lubricating layer or a chemically catalytic layer on a wide variety of substrates.

These objects and others which will become, more apparent hereinafter are attained in a process comprising decomposing a volatile molybdenum compound together with a volatile sulfur compound as reactive gases in a glow discharge to form a reaction gas mixture, setting a number of parameters of the glow discharge and reaction gas mixture including electric power in the glow discharge and pressure, composition and temperature of the reaction gas mixture to produce a molybdenum sulfide film having the desired values of essential film properties including density, electrical resistance, optical and triboelectric properties and depositing the molybdenum sulfide film on the substrate directly from the reaction gas mixture. As a molybdenum source molybdenum hexacarbonyl may be used, while as a sulfur source hydrogen sulfide is used. Advantageously the reactive gases are mixed with carrier gases. The molybdenum sulfide films may be deposited on a nonconducting or conducting substrate. Before coating the substrate can be subjected to an etching and cleaning process in a glow discharge.

The molybdenum sulfide film made according to our process is also to be considered as part of our invention. It can be used as a self-lubricating layer, an electrooptical layer, chemical catalytic layers to be used in the Chemical Industry and in Sensor technology.

The process according to our invention overcomes the above-mentioned disadvantages of the conventional art and corrects them clearly, since the manufacture of the molybdenum compounds proceeds in the presence of sulfur-containing reactive gases in a plasma. Thereby according to the treatment time layers of several hundred to about 5000 Å are obtained. As a Molybdenum source molybdenum hexacarbonyl is particularly good, since it is stable in air, convenient to meter and because of its oxygen content also can be used to make oxide containing films. However also other volatile molybdenum compounds can be used.

Hydrogen sulfide can be used as a source of sulfur. Also carbon disulfide, carbon oxysulfide or other sulfur compounds can be used.

The metallization occurs in normal plasma reactors, which are known primarily as pipe and tunnel reactors or as parallel plate reactors and reactors for corona discharges. For making molybdenum sulfide films the plasma can be made with direct current and also with alternating current or high frequency (including microwaves), usually produced in the kHz- or MHz region. The pressure in the plasma chamber amounts to about 5 to 100 Pa. The substrate can be either conducting or nonconducting. As substrates any of a variety of materials can be used: Polymers such as Polyimide, Epoxy resin, Polyethylene or polypropylene, Teflon, Polycarbonate, Polyester-condensation products such as Phenol/Formaldehyde Plastic among others; heavy-duty polymers, ceramics such as aluminum oxide, aluminum nitride, boron nitride, Zirconium oxide among others; glasses such as quartz or silicate glass among others and metals such as noble steel, nickel plated steel, metals with oxygen or nitrogen layers, copper, titanium among other things. The Molybdenum and sulfur compounds used for coatings according to our invention are fed as gases to the plasma reactor, advantageously by sublimation or evaporation.

They can be used alone, generally diluted in a carrier gas to obtain uniform pore-free layers. As carrier gases inert gases such as Argon and Helium or reducing gases such as hydrogen or mixtures thereof can be used. The feeding of the molybdenum and sulfur compounds occurs after adjustment of the vacuum outside the glow discharge region in the flow of carrier gases so that in the reaction zone a uniform gas mixture is present.

The supply container for the metal compound may be provided appropriately with a device for heating to be able to provide a higher partial pressure.

An alternative example of the process according to our invention consists in that before the metal process in the plasma discharge a plasma etching process is performed to clean the substrate surface and to sensitize the substrate for receipt of the metal layer. The example of the reactor and the process conditions do not differ in principle from the plasma metallization process. Understandably no organometallic compounds are used in the plasma-etching process. Advantageously reactive gases such as oxygen or tetrafluoromethane-oxygen are added to the inert gas.

The feeding of the Molybdenum compound the glow discharge region together with the reactive gas mixture occurs after making the vacuum so that in the actual reaction zone a uniform gas mixture is present.

Both the substrate etching and the molybdenum sulfide film production may be provided by the glow dischage. Pure carbon, carbon-/oxygen- or oxygen-containing layers are produced by reaction of Molybdenum compounds with sulfur compounds. By adjustment of the process parameters layers with different properties regarding Molybdenum/sulfur ratio, electrical, optical and triboelectrical properties are attained.

If the electrical power in the glow discharge is reduced, a film of reduced density with an increased molybdenum to sulfur ratio and reduced specific resistance is obtained.

If one increases the concentration of the reactive gas, the sulfur component in the film climbs and one obtains film with a molybdenum/sulfur ratio of between 0.7 and 1.4 depending on the power density used and with reduced density. The electrical resistance of the film remains unchanged.

If one uses pure Argon-hydrogen sulfide gas mixture without added hydrogen the molybdenum/sulfur ratio drops to a value under 1.3. Also the density of the film decreases, while the specific electric resistance climbs to about 2 powers of ten.

The substrate temperature amounts advantageously to a temperature between room temperature and 175° C. However in special cases other temperatures can be used.

The following examples serve to illustrate the invention.

EXAMPLES

EXAMPLE 1

| | |
|---|---|
| Substrate | Silicate or Quartz glass |
| Molybdenum compound | $Mo(CO)_6$ |
| Carrier gas | Argon/hydrogen 2:1 |
| Reactive gas | Hydrogen sulfide |
| Gas flow | Argon: 7 sccm; $H_2S$: 0.25 sccm |
| Electrode Temperature | 175° C. |
| Heating of Storage vessel | Omitted |
| Reactor | Parallel plate reactor |
| Frequency | HF (13.36 MHz) |
| Power density | 0.75 Watt/$cm^2$ |
| Pressure in reactor | 20 Pa |
| Reaction time | 60 Min for 0.2 micrometer film thickness |
| Units of sccm = Standard-$cm^3$ | |
| Properties: | |
| Density(ber.): | 4.8 g/$cm^3$(crystalline) Molybdenum sulfide: 4.8 g/$cm^3$ |
| specific Resistance | 1.2 ohm cm(0.1 to 10.1 ohm cm) |
| Atomic ratio Mo/S | 1.7(in $MoS_2$: Mo/S = 1.5) |
| Color | Glittering Black |

EXAMPLE 2

Different substrates (Ceramics, Aluminum oxide, Aluminum nitride, Epoxide, Polyimide, Noble Steel) are coated using the operating conditions set forth in Example 1. Each time black glossy, smooth electrically conductive films of about 2000 Å layer thickness arise.

The specific electrical resistance were measured according to the four points method with a device by Kulicke and Soffa, Modell 331. A test of this resistance value after many weeks standing in moist air showed that it had not changed.

The properties were produced with the socalled "as deposited" films which means the conditions as the exist in the reactor. An annealing (subsequent heat treatment for improvement of the crystal structure) or other after treatments required in other process must not be used here.

What is claimed is:

1. A molybdenum sulfide film made according to a process comprising the steps of decomposing a volatile molybdenum compound together with a volatile sulfur compound as reactive gases in a glow discharge to form a reaction gas mixture, admixing a carrier gas containing hydrogen with said reaction gas mixture, setting a power density of said glow discharge to be at least about 0.75 watt/$cm^2$ at a pressure of said reaction gas mixture of about 20 Pa and depositing the molybdenum sulfide film on the substrate directly from the reaction gas mixture, and wherein said molybdenum compound comprises molybdenum hexacarbonyl and said sulfur compound comprises hydrogen sulfide, said molybdenum sulfide film so formed having a density of about 4.8 g/cm$^3$ and an improved structure suitable for electrooptical and microelectronic applications.

2. A process of making a thin molybdenum sulfide film on a substrate, said molybdenum sulfide film having a number of physical properties including density, said process allowing the physical properties of the molybdenum sulfide film including the density to be varied over a wide range and to be adjusted to certain desired values corresponding to those of an electrooptically, mechanically and microelectronically suitable layer having said density about that of crystalline molybdenum sulfide, said process comprising the steps of decomposing a volatile molybdenum compound together with a volatile sulfur compound as reactive gases in a glow discharge to form a reaction gas mixture, setting a number of parameters of said glow discharge and said reaction gas mixture including electric power in said glow discharge and pressure, composition and temperature of said reaction gas mixture to produce a film having said desired values of said properties and depositing the molybdenum sulfide film on the substrate directly from the reaction gas mixture.

3. The process according to claim 2, wherein said molybdenum compound comprises molybdenum hexacarbonyl.

4. The process according to claim 2, wherein said sulfur compound comprises hydrogen sulfide.

5. The process according to claim 2, further comprising the step of admixing a carrier gas to said reaction gas mixture.

6. The process according to claim 2, wherein said substrate is one of nonconducting and conducting.

7. The process according to claim 2, wherein said substrate is selected from the group consisting of silicate glass, quartz glass, ceramics, polyimide, epoxy resin, polyethylene, polypropylene, teflon, polycarbonate, polyester-condensation products and metals.

8. The process according to claim 2 further comprising the additional step of subjecting said substrate to an etching and cleaning in said glow discharge prior to depositing.

9. The molybdenum sufide article made according to the process of claim 2.

10. A self-lubricating article made according to claim 9.

11. An electrooptical article made according to claim 9.

12. A chemically catalytic article for use in the chemical industry and in sensor technology made according to claim 9.

13. The process according to claim 2, wherein said thin molybdenum sulfide film has a thickness of from several hundred to 5000 Å.

14. The process according to claim 2, wherein said reaction gas mixture has a pressure from 5 to 100 Pa.

15. A process of making a thin molybdenum sulfide film on a substrate, said molybdenum sulfide film having a number of physical properties including density, said process allowing the physical properties of the molybdenum sulfide film including the density to be varied over a wide range and to be adjusted to certain desired values corresponding to those of an electrooptically, mechanically and microelectronically suitable layer, said process comprising the steps of decomposing a volatile molybdenum compound together with a volatile sulfur compound as reactive gases in a glow discharge to form a reaction gas mixture, admixing a carrier gas containing hydrogen with said reaction gas mixture, setting a power density of said glow discharge to be at least about 0.75 watt/cm$^2$ at a pressure of said reaction gas mixture of about 20 Pa and depositing the molybdenum sulfide film on the substrate directly from the reaction gas mixture, and wherein said molybdenum compound comprises molybdenum hexacarbonyl and said sulfur compound comprises hydrogen sulfide, said molybdenum sulfide film so formed having a density of about 4.8 g/cm$^3$ and an improved structure suitable for electrooptical and microelectronic applications.

* * * * *